United States Patent [19]

Maeda et al.

[11] Patent Number: 4,901,021

[45] Date of Patent: Feb. 13, 1990

[54] IMAGE CONSTRUCTING DEVICE INCLUDED IN A MAGNETIC RESONANCE IMAGING APPARATUS

[75] Inventors: Akira Maeda, Gardena, Calif.; Koichi Sano, Sagamihara, Japan; Tetsuo Yokoyama, Tokyo, Japan; Hideaki Koizumi, Katsuta, Japan

[73] Assignee: Hitachi, Ltd., Tokyo, Japan

[21] Appl. No.: 262,282

[22] Filed: Oct. 25, 1988

[30] Foreign Application Priority Data

Nov. 6, 1987 [JP] Japan ................. 62-279217

[51] Int. Cl.⁴ ............................................ G01R 33/20
[52] U.S. Cl. ..................................................... 324/309
[58] Field of Search ............... 324/300, 307, 309, 312, 324/314; 128/653

[56] References Cited

U.S. PATENT DOCUMENTS

| | | | |
|---|---|---|---|
| 4,361,807 | 11/1982 | Burl et al. | 324/309 |
| 4,506,223 | 3/1985 | Bottomley et al. | 324/309 |
| 4,567,440 | 1/1986 | Haselgrove | 324/309 |
| 4,581,582 | 4/1986 | Redington | 324/309 |
| 4,585,992 | 4/1986 | Maudsley | 324/309 |
| 4,585,993 | 4/1986 | Bottomley | 324/309 |
| 4,588,948 | 5/1986 | Mansfield | 324/309 |
| 4,618,827 | 10/1986 | Redington | 324/309 |
| 4,646,023 | 2/1987 | Young | 324/309 |
| 4,654,593 | 3/1987 | Ackerman | 324/309 |
| 4,689,568 | 8/1987 | Matsui | 324/309 |
| 4,698,592 | 10/1987 | Feinberg | 324/309 |
| 4,716,369 | 12/1987 | Sekihara | 324/309 |
| 4,733,185 | 3/1988 | Bottomley | 324/309 |

OTHER PUBLICATIONS

Y. S. Kim, C. W. Mun, and Z. H. Cho, "Chemical-Shift Imaging with Large Magnetic Field Inhomogeneity", (Magnetic Resonance in Medicine, vol. 4, No. 5, 1987, pp. 452–460).

Albert Macovski and Craig Meyer, "A Noval Fast-Scanning System", (Proceedings of 5th Society of Magnetic Resonance in Medicine, 1986, pp. 156–157).

*Primary Examiner*—Michael J. Tokar
*Attorney, Agent, or Firm*—Antonelli, Terry & Wands

[57] ABSTRACT

A magnetic resonance signal is detected at a plurality of different periods of time in accordance with the phase shift of a plurality of chemical shift components while varying the intensity of a gradient magnetic field with time, a plurality of magnetic resonance signals thus obtained are used for estimating a magnetic resonance signal due to only a predetermined chemical shift component, the phase rotation of the predetermined chemical shift component is corrected in the estimated resonance signal, and further a blur due to chemical shift components other than the predetermined one is corrected to obtain a tomogram formed of only the predetermined chemical shift component. Alternatively, one measured resonance signal is modified by an image construction algorithm peculiar to each of a plurality of chemical shift components, to obtain tomograms corresponding to the chemical shift components.

16 Claims, 3 Drawing Sheets

IMAGE CONSTRUCTING DEVICE INCLUDED IN A MAGNETIC RESONANCE IMAGING APPARATUS

BACKGROUND OF THE INVENTION

The present invention relates to an apparatus for obtaining a tomogram of a living body by utilizing the nuclear magnetic resonance phenomenon, and more particularly to an image constructing device suited to take out chemical shift components from measured resonance signals and to form a tomogram of each chemical shift component, by a high-speed imaging method in which a resonance signal is measured in a state that the strength of a gradient magnetic field is varied with time. Incidentally, the image construction means that a tomogram is constructed from a measured resonance signal.

A method of forming a tomogram of each chemical shift component in the magnetic resonance imaging (hereinafter referred to as "MRI") is described in, for example, an article entitled "Chemical-Shift Imaging with Large Magnetic Field Inhomogeneity" (Magnetic Resonance in Medicine, Vol. 4, No. 5, 1987, pages 452 to 460). In this method, resonance signals are measured at some different periods of time in a state that the strength of a gradient magnetic field is kept constant, tomograms of an object are constructed from measured resonance signals by the two-dimensional Fourier transformation method, and tomograms corresponding to chemical shift components are separated from the constructed tomograms. In more detail, each of the chemical shift components is slightly different in resonance frequency from each other. Thus, when a resonance signal is measured at different periods of time, tomograms corresponding to the chemical shift components are different from each other in phase, that is, in the state of nuclear spin. Further, image processing is carried out so that tomograms corresponding to undesired chemical shift components cancel each other on the basis of the above phase difference, to obtain tomograms each formed of a single chemical shift component.

While, a novel imaging method is described in, for example, an article entitled "A Novel Fast Scanning System" (Proceedings of 5th Society of Magnetic Resonance in Medicine, 1986, pages 156 and 157). In this method, a resonance signal is measured in a state that the strength of a gradient magnetic field is varied with time. As a result, the resonance signal can be continuously measured, and thus a time necessary for imaging can be shortened in a great degree.

However, the art concerning this method has given no consideration to the matter that tomograms due to chemical shift components may be constructed, by using a time-varying gradient magnetic field.

Now, let us express the tomogram formed of the i-th chemical shift component by $\rho_i(x, y)$, where x and y designate two-dimensional coordinate values on the tomogram, with the origin at the center of a field of view. Further, let us express the deviation of a resonance frequency of each chemical shift component from a reference frequency by $\Delta\omega_i$. It is to be noted that the reference frequency means the resonance frequency of each chemical shift component under a static magnetic field. Then, the resultant resonance signal S(t) of respective resonance signals of chemical shift components is given by the following equation:

$$S(t) = C \sum_i \int dxdy \rho_i(x, y)\exp[-j\gamma\{k_x(t)x + k_y(t)y\} + j\Delta\omega_i t] \quad (1)$$

where $k_x(t) = \int_0^t G_x(t')dt'$, $k_y(t) = \int_0^t G_y(t')dt'$, and $$j = \sqrt{-1}.$$

Further, $G_x$ and $G_y$ indicate the strength of x- and y-gradient magnetic fields, respectively, $\gamma$: a nuclear magnetogyric ratio, and C: a constant.

The inhomogeneity of static magnetic field and the $T_2$ effect (namely, transverse relaxation time effect) have no connection with the following explanation, and hence explanation thereof will be omitted. Now, let us consider a case where $G_x$ and $G_y$ are constant as in the two-dimensional Fourier transformation method, for example, a case where $G_x(t) = G_x^o$ (namely, a constant) and $G_y(t) = 0$ the resonance signal S(t) is rewritten as follows:

$$S(t) = C \sum_i \int dxdy \rho_i(x, y) \cdot \exp\left[-j\gamma \cdot G_x^o\left(x - \frac{\Delta\omega_i}{\gamma G_x^o}\right)t\right] \quad (2)$$

Thus, tomograms formed of different chemical shift components are deviated from each other by an amount equal to $\Delta\omega_i / G_x^o$. As a result, an overlapping tomogram is formed. In a case where $G_x$ and $G_y$ vary with time, however, signal components due to different chemical shift components do not appear as signal components which are merely deviated from each other, but interact on each other in a complicated manner. Thus, it is impossible to construct tomograms corresponding to chemical shift components at the same time. That is, the conventional chemical shift imaging method is inapplicable to a case where $G_x$ and $G_y$ vary with time.

SUMMARY OF THE INVENTION

It is accordingly an object of the present invention to provide an image constructing device which can solve the above problems and can form a tomogram of each chemical shift component directly by a high-speed imaging method using a time-varying gradient magnetic field.

In order to attain the above object, according to an aspect of the present invention, a resonance signal due to a desired chemical shift component is produced from a plurality of resonance signals measured at different periods of time, and an image construction algorithm peculiar to the desired chemical shift component is applied to the produced resonance signal, to form a tomogram of the desired chemical shift component.

A resonance signal $S_{\Delta T}(t)$ obtained at a time which is deviated from a predetermined time by $\Delta T$, is given by the following equation:

$$S_{\Delta T}(t) = C \sum_i \int dxdy \rho_i(x,y)\exp[-j\gamma\{k_x(t)x + k_y(t)y\} + j\Delta\omega_i t] \cdot \exp[j\Delta\omega_i \Delta T] \quad (3)$$

The final factor on the right-hand side of the equation (3) indicates that each chemical shift component contributing to the resonance signal $S_{\Delta T}(t)$ has a phase shift of $\exp[j\Delta\omega_i\Delta T]$. The resonance frequency $\omega_i$ of each chemical shift component is known, and hence the above phase shift is determined depending upon the time deviation $\Delta T$. By measuring resonance signals for a plurality of values of $\Delta T$ and performing an appropriate arithmetic operation for the resonance signals, a resonance signal $S_i(t)$ due to only the i-th chemical shift component can be obtained as follows:

$$S_i(t) = C\int dxdy \rho_i(x,y)\exp[-j\gamma(k_x(t)x + k_y(t)y) + j\Delta\omega_i t] \quad (4)$$

In a case where a tomogram is formed of the i-th chemical shift component, a resonance signal $\tilde{S}_i(t)$ which is obtained by removing the phase rotation due to a change in resonance frequency (that is, the phase shift from a reference frequency at a measuring time) from the equation (4), is expressed as follows:

$$\tilde{S}_i(t) = S_i(t)\exp[-j\Delta\omega_i T] \quad (5)$$

A tomogram due to the i-th chemical shift component is constructed by using the resonance signal $S_i(t)$.

Further, according to another aspect of the present invention, a tomogram can be formed of each chemical shift component in the following manner. By changing the character i in the equation (1) to i' and multiplying the equation (1) by $\exp[-j\omega_i t]$, a resonance signal $S_i(t)$ which places the focus on the i-th chemical shift component, is obtained as follows:

$$\overline{S_i}(t) = C\sum_{i'}\int dxdy \rho_{i'}(x, y) \cdot \exp[-j\gamma\{k_x(t)x + k_y(t)y\} + j(\Delta\omega_{i'} - \Delta\omega_i)t] \quad (6)$$

where $i = 1, 2, 3, \ldots, n$.

The resonance signal $S_i(t)$ given by the equation (6) is used for constructing a tomogram, in place of the resonance signal $S(t)$ given by the equation (1). In this case, a tomogram due to the i-th chemical shift component is correctly constructed. However, tomograms due to other chemical shift components are not correctly constructed because of the phase rotation due to a change in resonance frequency, but are superposed, as blurred tomograms, on the tomogram due to the i-th chemical shift component.

In order to separate the blurred tomograms from the tomogram due to the i-th chemical shift component, the following processing is carried out.

Now, let us express a tomogram with respect to the i-th chemical shift component formed in the above manner, by $\overline{\rho_i^{(0)}}(x, y)$. Then, the $\overline{\rho_i^{(0)}}(x, y)$ is given by the following equation:

$$\overline{\rho_i^{(0)}}(x, y) = \rho_i(x, y) + \sum_{i'\neq i}(h_{ii'}*\rho_{i'})(x, y) \quad (7)$$

where $\rho_i(x, y)$ indicates a true tomogram due to the i-th chemical shift component, a mathematical sign * convolution, and $h_{ii'}$ a blur function for the tomogram due to the i'-th chemical shift component in a case where the resonance signal $S_i(t)$ placing the focus on the i-th chemical shift component is used. Now, let us use $\overline{\rho_i^{(0)}}$ as an approximation to the true tomogram due to the i-th chemical shift component. Then, the tomograms due to chemical shift components other than the i-th chemical shift component can be substantially removed from the tomogram $\overline{\rho_i^{(0)}}(x, y)$ with respect to the i-th chemical shift component in a manner indicated by the following equation:

$$\overline{\rho_i^{(1)}}(x, y) = \overline{\rho_i^{(0)}}(x, y) - \sum_{i'\neq i}(h_{ii'}*\overline{\rho_{i'}^{(0)}})(x, y) \quad (8)$$

That is, a tomogram $\overline{\rho_i^{(1)}}(x, y)$ which is substantially identical with the true tomogram of the i-th chemical shift component, can be obtained. It is to be noted that a numeral in the parentheses located on the upper right side of the character $\rho$ indicates how many times the blur of a tomogram has been corrected.

As has been explained in the above, according to the present invention, chemical shift components are from the first separated from each other in a high-speed imaging method using a time-varying gradient magnetic field, to form a tomogram of each chemical shift component. Thus, a tomogram due to each chemical shift component can be constructed at high speed.

DESCRIPTION OF THE PREFERRED EMBODIMENTS

Now, embodiments of the present invention will be explained, with reference to FIGS. 1 to 7.

Figure 2:
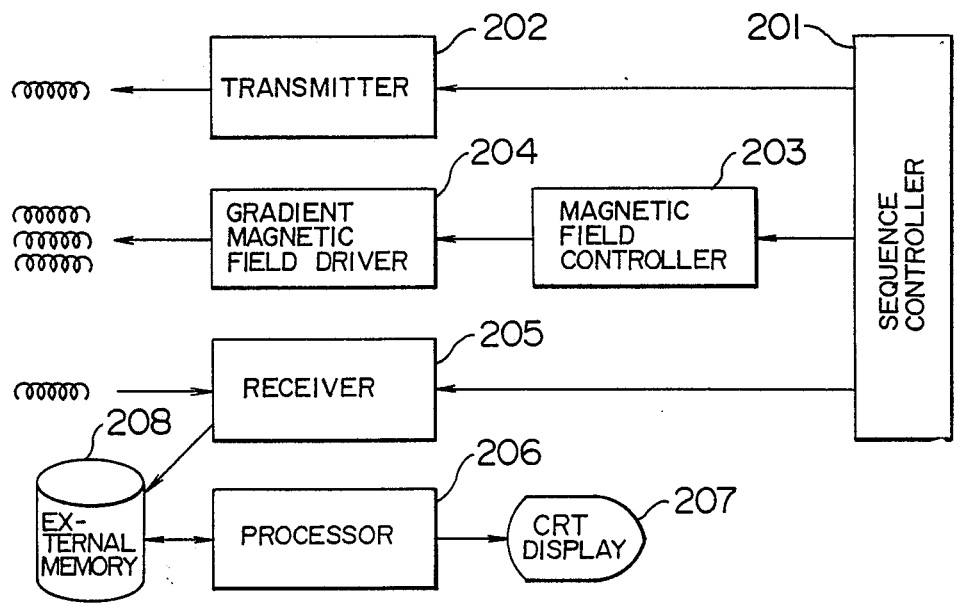
FIG. 2 is a block diagram showing the circuit configuration of an MRI apparatus.

FIG. 2 is a block diagram showing the circuit configuration of an MRI apparatus, in which the present invention is realized. Referring to FIG. 2, the MRI apparatus includes a sequence controller 201 for controlling each part of the apparatus in accordance with a predetermined procedure, a transmitter 202 for sending out a high-frequency pulse to generate magnetic resonance, a gradient magnetic field driver 204 for generating a gradient magnetic field, a magnetic field controller 203 for controlling the gradient magnetic field driver, a receiver 205 for receiving a magnetic resonance signal which is generated by an object to be inspected, and for subjecting the magnetic resonance signal to detection, a processor 206 for constructing a tomogram and for performing various arithmetic operations, a CRT display 207 for displaying a tomogram, and an external memory 208 for storing therein tomogram data and others.

Figure 3:
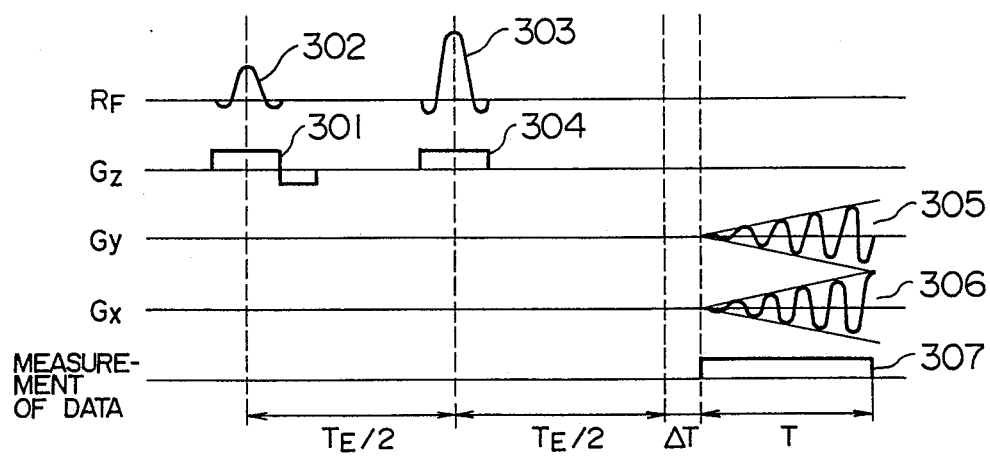
FIG. 3 is a schematic diagram showing an example of the pulse sequence in an embodiment of the present invention.

FIG. 3 shows an example of the pulse sequence which is used by the MRI apparatus of FIG. 2 to realize an embodiment of the present invention. Referring to FIG. 3, a 90°-RF pulse 302 is generated at the same time as a pulse 301 for generating a gradient magnetic field in a Z-direction is applied to a coil. Thus, spins in a desired slice plane (namely, an X-Y plane) are excited. Next, a 180°-RF pulse 303 for generating a spin echo and a pulse 304 for generating a gradient magnetic field in the Z-direction are simultaneously generated. Thereafter, a resonance signal is measured for a period T (indicated by reference numeral 307) in a state that a gradient magnetic field 305 in a Y-direction and a gradient magnetic field 306 in an X-direction are both generated. The strength of each of the gradient magnetic field 305 and the gradient magnetic field 306 varies with time. The gradient magnetic field 305 and the gradient magnetic field 306 are applied to obtain a resonance signal at various points on the X-Y plane. Let us express the time interval between the generation of the 90°-RF pulse 302 and the generation of the 180°-RF pulse 303 by TE/2. When a time TE/2 has elapsed after the 180°-RF pulse 303 was generated, the phase shift of every atom is returned to zero, and a spin echo signal is generated. Further, when a time $\Delta T$ has elapsed after the spin echo signal was generated, the gradient magnetic field 305 in the Y-direction and the gradient magnetic field 306 in the X-direction are both generated, and the measurement of resonance signal is started.

Figure 4:
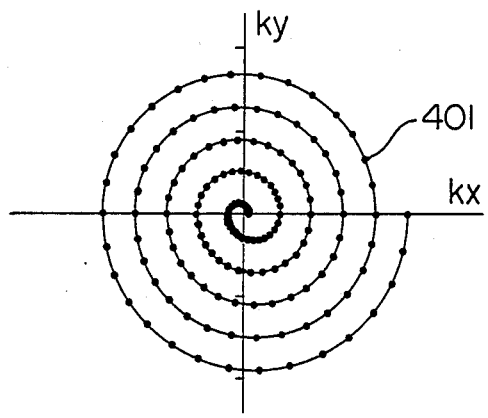
FIG. 4 is a graph showing the distribution of signal measuring point in a spatial frequency region.

FIG. 4 shows an example of the distribution of $k_x$ and $k_y$ which indicate the integrated values of the gradient magnetic field 306 and 305, respectively.

Now, let us suppose that $G_x(t)$ and $G_y(t)$ are given by the following equations:

$$\begin{cases} G_x(t) = A \cdot \cos Bt - AB \cdot \sin Bt \\ G_y(t) = A \cdot \sin Bt + AB \cdot \cos Bt \end{cases}$$

where A and B are constants.

Then, $k_x(t)$ and $k_y(t)$ are given by the following equations:

$$\begin{cases} k_x(t) = At \cdot \cos Bt \\ k_y(t) = At \cdot \sin Bt \end{cases}$$

Thus, the combination of $k_x(t)$ and $k_y(t)$ will produce the locus shown in FIG. 4. In FIG. 4, reference numeral 401 indicates one of measuring time moments which are arranged at a time interval in the period 307.

Figure 5:
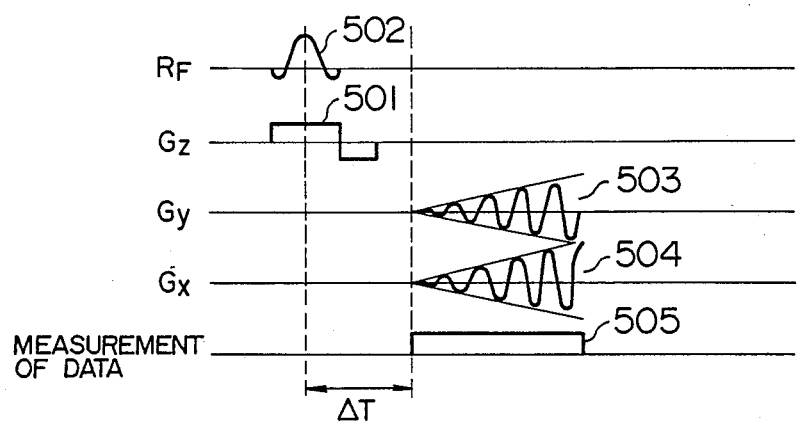
FIG. 5 is a schematic diagram showing another example of the pulse sequence in an embodiment of the present invention.

FIG. 5 shows a sequence in a case where a 180°-RF pulse is not used, but an echo signal due to the reversal of a gradient magnetic field is measured. Referring to FIG. 5, a pulse 501 for generating a gradient magnetic field in the Z-direction and a 90°-RF pulse 502 are simultaneously generated to excite only spins in a desired slice plane, as in the sequence of FIG. 3. When a time $\Delta T$ has elapsed after the 90°-RF pulse 502 was generated, a resonance signal is measured for a period 505 in a state that a gradient magnetic field 503 in the Y-direction and a gradient magnetic field 504 in the X-direction are generated.

The present invention can be realized in the same manner for the sequences of FIGS. 3 and 5.

Figure 1:
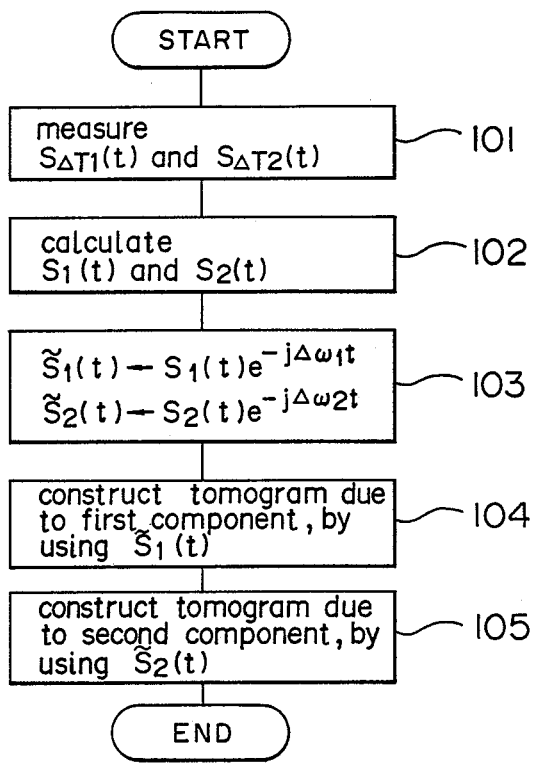
FIG. 1 is a flow chart showing an example of the processing in an embodiment of the present invention.

FIG. 1 is a flow chart showing the steps of procedure for constructing tomograms in accordance with the present invention, for a case where only two chemical shift components are detected.

In step 101 of FIG. 1, a resonance signal $S_{\Delta T_1}(t)$ for $\Delta T = \Delta T_1$ and a resonance signal $S_{\Delta T_2}(t)$ for $\Delta T = \Delta T_2$ ($\Delta T_2 \neq \Delta T_1$) are measured (where $0 \leq t \leq T$). It is to be noted that the above-mentioned $\Delta T$ indicates $\Delta T$ in FIGS. 3 and 5.

In step 102, a resonance signal $S_1(t)$ due to only the first chemical shift component and a resonance signal $S_2(t)$ due to only the second chemical shift component are determined by the following equations:

$$S_1(t) = (S_{\Delta T_1}(t)e^{-j\Delta\omega_2\Delta T_1} - S_{\Delta T_1}(t)e^{-j\Delta\omega_2\Delta T_2})$$
$$/ \{e^{j(\Delta\omega_1 - \Delta\omega_2)\Delta T_1} - e^{j(\Delta\omega_1 - \Delta\omega_2)\Delta T_2}\}$$

$$S_2(t) = (S_{\Delta T_1}(t)e^{-j\Delta\omega_1\Delta T_1} - S_{\Delta T_2}(t)e^{-j\Delta\omega_1\Delta T_2})$$
$$/ \{e^{j(\Delta\omega_2 - \Delta\omega_1)\Delta T_1} - e^{j(\Delta\omega_2 - \Delta\omega_1)\Delta T_2}\}$$

In order to determine the resonance signals $S_1(t)$ and $S_2(t)$ by the above equations, it is required to satisfy the following formula:

$$(\Delta\omega_2 - \Delta\omega_1) \times (\Delta T_2 - \Delta T_1) \neq 2n\pi$$

where n is an integer.

Accordingly, the values of $\Delta T_1$ and $\Delta T_2$ are previously selected so as to satisfy, for example, the following equation:

$$(\Delta\omega_2 - \Delta\omega_1) \times (\Delta T_2 - \Delta T_1) = \pi$$

In step 103, the phase orientation due to a change in resonance frequency is corrected as indicated by the following equations:

$$\begin{cases} \widetilde{S}_1(t) = S_1(t)e^{-\Delta\omega_1 t} \\ \widetilde{S}_2(t) = S_2(t)e^{-\Delta\omega_2 t} \end{cases}$$

Thus, resonance signals $\widetilde{S}_1(t)$ and $\widetilde{S}_2(t)$ which will be produced under a static magnetic field, are obtained from the resonance signals $S_1(t)$ and $S_2(t)$.

In step 104, a tomograms $\bar{\rho}_1(x, y)$ due to the first chemical shift component is determined from the resonance signal $S_1(t)$ by the following equation:

$$\bar{\rho}_1(x, y) = Re\left[ \int_0^T dt W(t) \widetilde{S}_1(t) e^{+j\gamma\{k_x(t)x + k_y(t)y\}} \right]$$

where W(t) is a weight coefficient for adjusting a point-image response function which shows the degree of blur, and Re[ ] is a sign for using a real part. In a case where the locus of FIG. 4 is used, the weight coefficient W(t) is given by the following equation:

$$W(t) = \sqrt{k_x(t)^2 + k_y(t)^2}$$

In step 105, a tomogram $\bar{\rho}_2(x, y)$ due to the second chemical shift component is determined, as in the step 104, from the resonance signal $\widetilde{S}_2(t)$ by the following equation:

$$\bar{\rho}_2(x, y) = Re\left[ \int_0^T dt W(t) \widetilde{S}_2(t) e^{+j\gamma\{k_x(t)x + k_y(t)y\}} \right]$$

That is, the tomogram due to the first chemical shift component and the tomogram due to the second chemical shift component can be constructed by the above steps.

Figure 6:
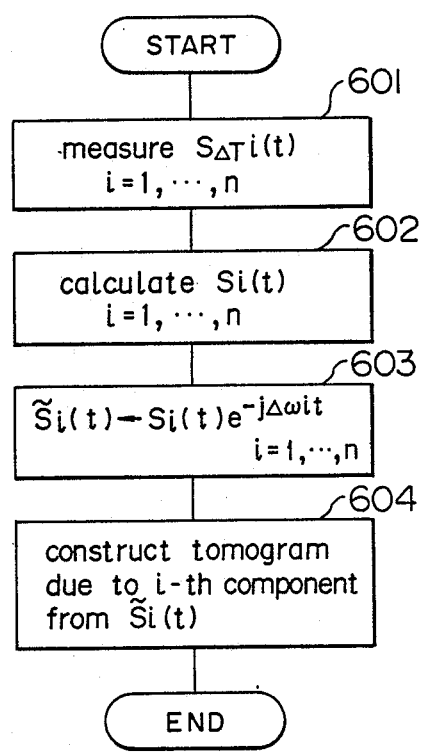
FIG. 6 is a flow chart showing another example of the processing in an embodiment of the present invention.

FIG. 6 is a flow chart showing the steps of procedure for constructing tomograms in accordance with the present invention, for a case where n chemical shift components are included.

In step 601 of FIG. 6, a resonance signal $S_{\Delta T1}(t)$ for $\Delta T = \Delta T_1$, a resonance signal $S_{\Delta T2}(t)$ for $\Delta T = \Delta T_2$ and a resonance signal $S_{\Delta Tn}(t)$ for $\Delta T = \Delta T_n$ are measured (where $0 \leq t \leq \Delta T$). It is to be noted that the above-mentioned T and $\Delta T$ indicate T and $\Delta T$ shown in FIGS. 3 and 5, respectively.

In step 602, a resonance signal $S_i(t)$ due to only the i-th chemical shift component (where $i = 1, 2, \ldots,$ and n) is determined by the following equation:

$$\begin{pmatrix} S_1(t) \\ S_2(t) \\ \cdot \\ \cdot \\ \cdot \\ S_n(t) \end{pmatrix} = A^{-1} \begin{pmatrix} S_{\Delta T1}(t) \\ S_{\Delta T2}(t) \\ \cdot \\ \cdot \\ \cdot \\ S_{\Delta Tn}(t) \end{pmatrix}$$

where a matrix A is given by the following equation:

$$A = \begin{pmatrix} e^{j\Delta\omega 1 \Delta T1} & e^{j\Delta\omega 2 \Delta T1} & \ldots & e^{j\Delta\omega n \Delta T1} \\ e^{j\Delta\omega 1 \Delta T2} & e^{j\Delta\omega 2 \Delta T2} & \ldots & e^{j\Delta\omega n \Delta T2} \\ \cdot & \cdot & & \cdot \\ \cdot & \cdot & & \cdot \\ \cdot & \cdot & & \cdot \\ e^{j\Delta\omega 1 \Delta Tn} & e^{j\Delta\omega 2 \Delta Tn} & \ldots & e^{j\Delta\omega n \Delta Tn} \end{pmatrix}$$

Values of $\Delta T_1$ to $\Delta T_n$ are selected so that an inverse matrix $A^{-1}$ can be formed.

In step 603, a resonance signal $\tilde{S}_i(t)$, in which the phase rotation due to a change in resonance frequency has been corrected, is obtained in the following manner:

$$\tilde{S}_i(t) = S_i(t)e^{-j\Delta\omega it}$$

where $i = 1, 2, 3, \ldots,$ and n.

In step 604, a tomogram $\bar{\rho}_i(x, y)$ due to the i-th chemical shift component is determined from the resonance signal $\tilde{S}_i(t)$ by the following equation:

$$\bar{\rho}_i(x, y) = Re\left[ \int_0^T dt W(t) \tilde{S}_i(t) e^{+j\gamma\{k_x(t)x + k_y(t)y\}} \right]$$

That is, n tomograms corresponding to n chemical shift components can be separately constructed by the above steps.

Figure 7:
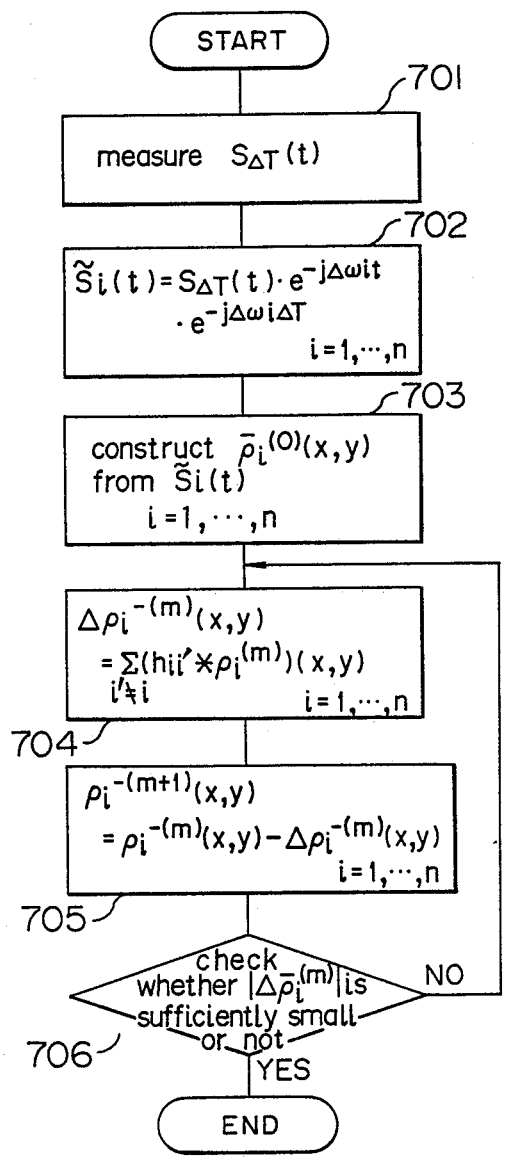
FIG. 7 is a flow chart showing an example of the processing in another embodiment of the present invention.

FIG. 7 is a flow chart showing the steps of procedure for obtaining n tomograms corresponding to n chemical shift components, from one measured resonance signal.

In step 701 of FIG. 7, a single resonance signal $S_{\Delta T}(t)$ is measured in the sequence shown in one of FIGS. 3 and 5. In this case, $\Delta T$ may be set to a desired value.

In step 702, a resonance signal $\tilde{S}_i(t)$ is determined by the following equation:

$$\tilde{S}_i(t) = S_{\Delta T}(t) e^{-j\Delta\omega i(t + \Delta T)}$$

where $i = 1, 2, 3, \ldots,$ and n.

In step 703, a tomogram $\bar{\rho}_i^{(0)}(x, y)$ with respect to the i-th chemical shift component is determined from the resonance signal $\tilde{S}_i(t)$ by the following equation:

$$\bar{\rho}_i^{(0)}(x, y) = Re\left[ \int_0^T dt W(t) \tilde{S}_i(t) e^{+j\gamma\{k_x(t)x + k_y(t)y\}} \right]$$

In step 704, a blur correcting value $\Delta\bar{\rho}_i^{(m)}(x, y)$ obtained after m repetitions (where $m = 0, 1, 2, 3, \ldots$) of the step 704 through a step 706 is determined by the following equation:

$$\Delta\bar{\rho}_i^{(m)}(x, y) = \sum_{i' \neq i} (k_{ii'} * \bar{\rho}_{i'}^{(m)})(x, y)$$

where a sign * indicates convolution, and $k_{ii'}$ is given by the following equation:

$$k_{ii'}(x, y) =$$

$$Re\left[ \int_0^T dt W(t) e^{+j\gamma\{k_x(t)x + k_y(t)y\}} \cdot e^{+j\gamma(\Delta\omega 1' - \Delta\omega 1)(t + \Delta T)} \right]$$

That is, the term $(k_{ii'} * \bar{\rho}_{i'}^{(m)})(x, y)$ is defined by the following equation:

$$(k_{ii'} * \bar{\rho}_{i'}^{(m)})(x, y) \overset{\Delta}{=} \int dx' dy' k_{ii'}(x - x', y - y') \cdot \bar{\rho}_{i'}^{(m)}(x', y')$$

In step 705, a tomogram $\bar{\rho}_i^{(m+1)}(x, y)$ at the (m+1)th repetition is determined by the following equation:

$$\bar{\rho}_i^{(m+1)}(x, y) = \bar{\rho}_i^{(m)}(x, y) - \Delta\bar{\rho}_i^{(m)}(x, y)$$

In step 706, the blur correcting value $\Delta\bar{\rho}_i^{(m)}(x, y)$ obtained by m repetitions is checked. When this blur correcting value is sufficiently small, it is considered that the blur has converged, and the processing terminates. When the blur correcting value is not small, the processing is returned to the step 704.

By the above steps, n tomograms corresponding to n chemical shift components can be separately constructed from one measured resonance signal $S_{\Delta T}(t)$.

Further, in the processing according to the flow chart of FIG. 7, the blur correcting value $\Delta\bar{\rho}_i^{(m)}(x, y)$ obtained after m repetitions of the step 704 may be replaced by $P[\bar{\rho}_i^{(m)}(x, y)]$, where P is a function given by the following equations:

$$P[a] = a \text{ if } a \geq 0$$
$$= 0 \text{ if } a < 0$$

In more detail, a correct tomogram due to the i-th chemical shift component corresponds to an image indicative of spin density distribution, and hence has a positive value. Accordingly, when a tomogram has a negative value, the function P is considered to be equal to zero. Thus, the processing of FIG. 7 will be rapidly completed.

Further, the number of repetitions of the step 704 may be limited to a desired value.

As can be seen from the above explanation, the present invention is independent of how the strength of gradient magnetic field varies with time, and is also independent of the algorithm for constructing a tomogram. Further, the present invention is applicable to a case where a three-dimensional spin-density image is formed of a single chemical shift component.

In the present invention, all the steps of procedure for forming a tomogram include only linear operations. Accordingly, the order of the step for obtaining $\widetilde{S}_i(t)$ from $S_{\Delta T}(t)$ and the step for forming a tomogram of a chemical shift component, may be inverted, that is, an arithmetic operation used in the step 702 for obtaining $\widetilde{S}_i(t)$ from $S_{\Delta T}(t)$ may be performed by arithmetic operation from the tomogram constructed in the tomogram forming step.

We claim:

1. An image constructing device included in a magnetic resonance imaging apparatus, the device comprising:
   a plurality of magnetic-field generating means for generating a static magnetic field, gradient magnetic fields and a high-frequency magnetic field, the static, gradient and high-frequency magnetic fields being applied to an object to be inspected;
   means for controlling the output of each of the magnetic-field generating means in accordance with a predetermined procedure;
   means for measuring resonance signals from the to-be-inspected object at different periods of time under the condition that the strengths of the gradient magnetic fields are changed as the time elapses;
   means for estimating a resonance signal due to only a predetermined chemical shift component, from a plurality of measured resonance signals; and
   means for constructing a tomogram due to the predetermined chemical shift component, from the estimated resonance signal.

2. An image constructing device according to claim 1, wherein the resonance-signal estimating means includes means for performing an arithmetic operation for a plurality of resonance signals measured at different periods of time.

3. An image constructing device according to claim 1, wherein the tomogram constructing means includes means for correcting the estimated resonance signal by using an image construction algorithm peculiar to the predetermined chemical shift component.

4. An image constructing device according to claim 2, wherein the tomogram constructing means includes means for correcting the estimated resonance signal by using an image construction algorithm peculiar to the predetermined chemical shift component.

5. An image constructing device according to claim 3, wherein the correcting means includes a means for correcting the phase rotation of the estimated resonance signal and a means for correcting a blur, on the basis of the image construction algorithm.

6. An image constructing device according to claim 4, wherein the correcting means includes a means for correcting the phase rotation of the estimated resonance signal and a means for correcting a blur on the basis of the image construction algorithm.

7. An image constructing device included in a magnetic resonance imaging apparatus, the device comprising:
   a plurality of magnetic-field generating means for generating a static magnetic field, gradient magnetic fields and a high-frequency magnetic field, the static, gradient and high-frequency magnetic fields being applied to an object to be inspected;
   means for controlling the output of each of the magnetic-field generating means in accordance with a predetermined procedure;
   means for measuring a resonance signal from the to-be-inspected object at a predetermined time under the condition that the strengths of the gradient magnetic fields are changed as the time elapses;
   means for correcting the measures resonance signal by using an image construction algorithm peculiar to each of a plurality of chemical shift components, to obtain a plurality of corrected resonance signals; and
   means for constructing tomograms corresponding to the chemical shift components, from the corrected resonance signals.

8. An image constructing device according to claim 7, wherein the correcting means includes a means for correcting the phase rotation peculiar to each of the chemical shift components, in the measured resonance signal, and a means for correcting a blur on the basis of the image construction algorithm.

9. An image constructing device according to claim 7, wherein the tomogram constructing means includes means for estimating and removing the influence of chemical shift components other than a predetermined chemical shift component on a tomogram formed of the predetermined chemical shift component.

10. An image constructing device according to claim 8, wherein the tomogram constructing means includes means for estimating and removing the influence of chemical shift components other than a predetermined chemical shift component on a tomogram formed of the predetermined chemical shift component.

11. An image constructing device according to claim 9, wherein the influence estimating/removing means repeats an influence estimating/removing operation for the predetermined chemical shift component so that the influence of chemical shift components other than the predetermined chemical shift component on the tomogram formed of the predetermined chemical shift component becomes less than a predetermined level.

12. An image constructing device according to claim 10, wherein the influence estimating/removing means repeats an influence estimating/removing operation for the predetermined chemical shift component so that the influence of chemical shift components other than the predetermined chemical shift component on the tomogram formed of the predetermined chemical shift component becomes less than a predetermined level.

13. An image constructing device included in a magnetic resonance imaging apparatus, the device comprising:
   a plurality of magnetic-field generating means for generating a static magnetic field, gradient magnetic fields and a high-frequency magnetic field, the static, gradient and high-frequency magnetic fields being applied to an object to be inspected;
   means for controlling the output of each of the magnetic-field generating means in accordance with a predetermined procedure;

means for measuring a resonance signal from the to-be-inspected object at a predetermined time under the condition that the strengths of the gradient magnetic fields are changed as time elapses;

means for correcting the measured resonance signal by using an image construction algorithm peculiar to a predetermined one of a plurality of chemical shift components, to obtain a corrected resonance signal;

first tomogram-constructing means for constructing a tomogram due to the predetermined chemical shift component, from the corrected resonance signal; and second tomogram-constructing means for constructing tomograms due to other chemical shift components than the predetermined one, from the tomogram due to the predetermined chemical shift component.

14. An image constructing device according to claim 13, wherein the second tomogram-constructing means includes means for performing a predetermined arithmetic operation for the tomogram obtained by the first tomogram-constructing means, means for performing an arithmetic operation between the tomograms obtained as the result of the predetermined arithmetic operation, and means for estimating the tomograms due to other chemical shift components than the predetermined one, on the basis of the result of the arithmetic operation.

15. An image constructing device according to claim 13, wherein the correcting means includes a means for correcting the phase rotation peculiar to the predetermined chemical shift component, in the measured resonance signal, and a means for correcting a blur on the basis of the image construction algorithm.

16. An image constructing device according to claim 14, wherein the correcting means includes a means for correcting the phase rotation peculiar to the predetermined chemical shift component, in the measured resonance signal, and a means for correcting a blur on the basis of the image construction algorithm.

* * * * *